United States Patent [19]
Weinberger et al.

[11] Patent Number: 5,173,606
[45] Date of Patent: Dec. 22, 1992

[54] SUPERCONDUCTOR ELECTROMAGNETIC RADIATION DETECTOR

[75] Inventors: Bernard R. Weinberger, Avon; Daniel M. Potrepka, Manchester; Lahmer Lynds, Jr., Glastonbury, all of Conn.

[73] Assignee: United Technologies Corporation, Hartford, Conn.

[21] Appl. No.: 754,481

[22] Filed: Sep. 3, 1991

[51] Int. Cl.$^5$ .......................................... H01L 39/02
[52] U.S. Cl. ................................. 250/336.2; 505/848; 505/849
[58] Field of Search ..................... 250/336.2; 505/848, 505/849

[56] References Cited

U.S. PATENT DOCUMENTS

| | | | |
|---|---|---|---|
| 4,149,075 | 4/1979 | Drukier et al. | 250/336.2 |
| 4,843,446 | 7/1989 | Nishino et al. | 357/5 |
| 4,873,443 | 10/1989 | Schneider | 250/336.2 |
| 4,931,427 | 6/1990 | Chien | 505/1 |
| 4,954,481 | 9/1990 | DeReggi et al. | 505/1 |
| 5,028,786 | 7/1991 | Da Silva et al. | 250/336.2 |

FOREIGN PATENT DOCUMENTS 880121  8/1982  U.S.S.R. ............................ 250/336.2

OTHER PUBLICATIONS

"Optically Induced Changes in the Magnetic Properties of the Ceramic Superconductor $La_{1.8}Ba_{0.2}CuO_4$", by R. Laiho et al., published by Phys. Rev. B, Condens. Matter, vol. 42, No. 1, pt. A, pp. 347-353 (1 Jul. 1990).

"Super (Conductor) Man", by A. Fisher, published in Popular Science, Dec. 1989, pp. 76-77.

"Performance of High Temperature Superconductor Ceramic-Polymer Composite", by C. Vipulanandan et al. published in Mat. Res. Bull, vol. 24, pp. 1059-1067, 1989.

Primary Examiner—Carolyn E. Fields
Attorney, Agent, or Firm—George J. Romanik

[57] ABSTRACT

A superconductor electromagnetic radiation detector includes a superconductor composite (2) that has a matrix (6) transparent to electromagnetic radiation wavelengths to be detected and a plurality of superconductor particles (4) dispersed in the matrix (6). The detector also includes remote means for detecting a physical response of the superconductor particles (4) to electromagnetic radiation. The physical response of the superconductor particles (4) to electromagnetic radiation indicates the presence of electromagnetic radiation. A method of detecting electromagnetic radiation includes illuminating a plurality of superconductor particles (4) dispersed in the matrix (6) of a superconductor composite (2) with electromagnetic radiation and remotely detecting a physical response to the superconductor particles (4) to the electromagnetic radiation.

16 Claims, 2 Drawing Sheets

SUPERCONDUCTOR ELECTROMAGNETIC RADIATION DETECTOR

DESCRIPTION

1. Technical Field

The present invention is directed towards a superconductor electromagnetic radiation detector.

2. Background Art

Electromagnetic radiation detectors, particularly photosensitive detectors, have a variety of scientific, industrial, and military uses. Several kinds of photosensitive detectors are available, the most common being a photoelectric cell.

Superconductor optical detectors are another promising photosensitive device. Such detectors use the inherent sensitivity of superconductors to electromagnetic radiation, particularly light, to detect the presence of radiation. Superconductors respond to photons by exhibiting at least a partial loss of superconductivity. The loss of superconductivity may be a bolometric effect, that is, a response to equilibrium heating, caused by photons striking the superconductor. It also may be caused by a more subtle nonequilibrium photon-superconductor interaction such as Cooper-pair breaking, optical modulation of the phase of a superconducting wave function across a Josephson junction, or photon-activated flux depinning. The extent of the superconductivity loss is related to the depth to which photons penetrate the superconductor, the superconductor's temperature, the strength of the magnetic field surrounding the superconductor, and the amount of electrical current the superconductor is carrying.

The loss of superconductivity may be manifested by an increase in electrical resistance that can be measured by conventional means. For example, a superconductor optical detector, which typically includes a thin film superconductor, may be connected to a conventional four-wire electrical resistance meter. At times, however, direct electrical or physical contact with the superconductor can be inconvenient. Moreover, good electrical connections are difficult to make with ceramic superconductors, such as $YBa_2Cu_3O_{7-\delta}$ (YBCO). Therefore, devices capable of detecting electromagnetic radiation remotely, that is, without direct physical or electrical contact, would be desirable.

Accordingly, what is needed in the industry is a device capable of remotely detecting a photon-induced change in superconducting properties.

DISCLOSURE OF THE INVENTION

The present invention is directed towards a device capable of remotely detecting a photon-induced change in superconducting properties.

One aspect of the invention includes a superconductor electromagnetic radiation detector with a superconductor composite that has a matrix transparent to electromagnetic radiation wavelengths to be detected and a plurality of superconductor particles dispersed in the matrix The detector also includes remote means for detecting a physical response of the superconductor particles to electromagnetic radiation. The physical response of the superconductor particles to electromagnetic radiation indicates the presence of electromagnetic radiation.

Another aspect of the invention includes a method of detecting electromagnetic radiation including illuminating a plurality of superconductor particles dispersed in the matrix of a superconductor composite with electromagnetic radiation and remotely detecting a physical response of the superconductor particles to the electromagnetic radiation.

The foregoing and other features and advantages of the present invention will become more apparent from the following description and accompanying drawings.

BEST MODE FOR CARRYING OUT THE INVENTION

The detector of the present invention uses a superconductor composite to detect electromagnetic radiation, such as visible light, infrared radiation, and microwave radiation, that causes a loss of superconductivity. Rather than rely on a change in electrical resistance to detect the loss of superconductivity, the detector of the present invention uses changes in the superconductor composite's diamagnetism or microwave surface resistance. Detecting changes in these properties may be done remotely, that is, without physical contact or a direct electrical connection to the superconductor composite.

Figure 1:
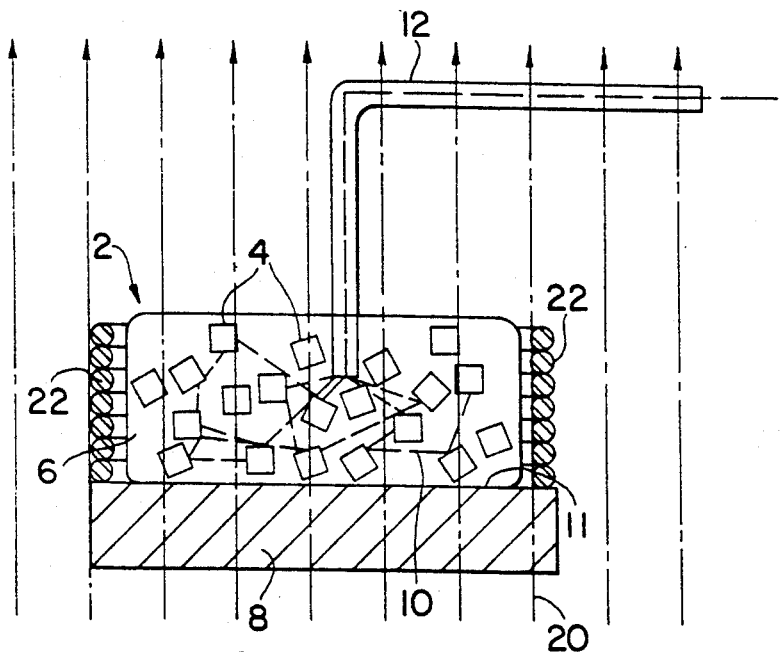
FIG. 1 is a sectioned elevation view of a superconductor composite of the present invention surrounded by a coil used to detect the composite's response to electromagnetic radiation.

The superconductor composite 2, shown in FIG. 1, comprises a plurality of superconductor particles 4 dispersed in a matrix 6. The composite 2, which may be self-supporting, may be positioned on a suitable base 8, if desired. The superconductor particles 4 may be made from any superconductor, including low temperature and high temperature superconductors. Suitable low temperature superconductors include elementals, such as niobium, tin, lead, and other elements, and alloys or compounds, such as $Nb_3Sn$, $Nb_3Ti$, and other alloys and compounds. Suitable high temperature superconductors include the so-called 1-2-3 materials, such as $YBa_2Cu_3O_{7-\delta}$ (YBCO) and similar materials in which Y is replaced with Sm, Eu, Gd, Dy, Ho, or Yb, the Bi-Sr-Ca-Cu-0 family of superconductors, and the Tl-Ba-Ca-Cu-0 family of superconductors. If desired, more than one type of superconductor may be dispersed in the matrix.

Where possible, the superconductor particles 4 should have dimensions that are about equal to both the absorption depth of the radiation to be detected and the radiation's wavelength to enhance the detector's response to the radiation. Particles with dimensions about equal to the radiation's absorption depth absorb the greatest possible amount of radiation, while permitting close to 100% of the particle's superconductivity to be lost. Particles with dimensions about equal to the radiation's wavelength scatter and randomize light, thereby uniformly illuminating the interior of the composite and increasing the amount of radiation trapped by the composite. If the particles' dimensions cannot practicably correspond to both the radiation's absorption depth and wavelength simultaneously, as may be the case for long wavelength radiation such as microwaves, the particles' dimensions should correspond to only the radiation's absorption depth. Various radiation trapping means, described below, may then be used to enhance radiation trapping. The particles may be either randomly dispersed in the matrix or ordered. If an applied magnetic field will be used to enhance the response to radiation, particles having high aspect ratio surfaces that are ordered perpendicular to the magnetic field may be desirable. The composite may contain any amount of superconductor particles sufficient to generate a measurable response when the composite is exposed to electromagnetic radiation and that permits a structurally stable composite to be formed.

The superconductor particles 4 may be made from larger pieces of superconductor by any conventional method. The larger pieces of superconductor may themselves be made by any conventional method. For example, superconductors that are elements or metal alloys may be made by well-known metallurgical techniques. Ceramic superconductors may be made by any conventional method, including grinding suitable solid reactants to form a reactant mixture, heating the reactant mixture to convert it to the desired superconductor, regrinding and reheating the reactants and product as needed to achieve complete conversion, and sintering the final product. Ceramic superconductors also may be made by dissolving suitable reactants or reactant precursors in a hot, concentrated acid, such as nitric acid, to form an aqueous solution and evaporating water from the solution to produce a fine powder that can be further processed by heating and grinding. The particles 4 may be made by conventional mechanical methods, such as grinding or tumbling the superconductor. Alternately, the particles may be made by chemical methods.

The matrix 6 may be any material that is sufficiently transparent to the wavelengths to be detected to permit the composite to respond to should have sufficient structural integrity to support the superconductor particles. Suitable matrix materials include paraffin wax, epoxies, which are typically transparent to broad band visible light, glasses, ceramics, and minerals, such as alumina, quartz, or sapphire. Matrix materials that enhance radiation trapping or are selectively transparent to particular wavelengths may be especially desirable. The material used to make the matrix may initially be a powder, a liquid, a suspension, or any other convenient form. The matrix itself may be a compacted powder, a solid, a gel, or any other convenient form after the composite is made.

The superconductor composite 2 may be made by any conventional composite fabrication method that permits superconductor particles 4 to be dispersed in the chosen matrix without damage. The fabrication conditions should be compatible with both the superconductor particles and the matrix. For example, if the superconductor particles are made from a high temperature superconductor, such as YBCO, the fabrication temperature should be below about 700° C. to avoid converting the superconductor into a nonsuperconducting phase. A composite that contains only a matrix and superconductor particles may be fabricated at any pressure compatible with the matrix. If the composite contains additional phases, such as materials to enhance radiation trapping as described below, the range of suitable fabrication pressures may be more limited.

The particular method used to make the superconductor composite depends on its matrix. For example, if the composite's matrix is an epoxy, the superconductor particles may be dispersed in a liquid epoxy resin that is then cured to form a solid matrix. If the matrix is glass or ceramic, the superconductor particles may be mixed with a glass or ceramic powder and the mixture may be pressed to consolidate it into a desired shape. Alternately, the superconductor particle/glass or ceramic powder mixture may be fused, formed into a desired shape, and cooled to form a solid composite. A similar process may be used for a paraffin wax matrix. The composite may contain any amount of superconductor particles sufficient to generate a measurable response when the composite is exposed to electromagnetic radiation and that permits a structurally stable composite to be formed. Composites containing more superconductor particles per unit volume than other composites may provide a stronger response to radiation because they can absorb more radiation per unit volume. If the superconductor particles are to have a particular orientation in the matrix, they may be ordered in any conventional way. For example, particles that are both magnetically active and magnetically anisotropic may be dispersed in a liquid matrix precursor, such as a liquid epoxy resin, and exposed to a magnetic field to align them in a particular plane. Some low temperature superconductors and high temperature ceramic superconductors containing gadolinium or holmium, such as $GdBa_2Cu_3O_{7-\delta}$ or $HoBa_2Cu_3O_{7-\delta}$, can respond to the magnetic field.

To enhance the superconductor composite's response to electromagnetic radiation, the composite may incorporate any suitable radiation trapping means. Typically, these means increase the radiation's path length through the composite to increase the likelihood that the radiation will be absorbed. Many of these means operate by reflecting radiation that would otherwise not be absorbed back into the composite. Radiation trapping means developed for the photovoltaic cell industry may be particularly appropriate for use with the present invention. For example, superconductor particles used to detect visible light or near infrared radiation may be textured on at least one surface to increase their reflectivity. The texture may include randomly spaced, densely packed microstructures having dimensions on the order of the wavelength to be detected. The texture may be created with various lithographic methods known in the photovoltaic cell art. All composites of the present invention used to detect visible light and near infrared radiation incorporate at least one radiation trapping means—the superconductor particles dispersed in the matrix. These particles randomize and scatter radiation throughout the matrix, evenly illuminating the composite's interior and increasing the radiation's path length. This effect is shown schematically in FIG. 1 by the dashed lines 10. A similar effect could be achieved by dispersing reflective, nonsuperconducting particles, such as MgO particles, in the matrix. A reflective surface 11 adjacent to the composite, as shown, or embedded in the matrix also may be used as a radiation trapping means.

Figure 2:
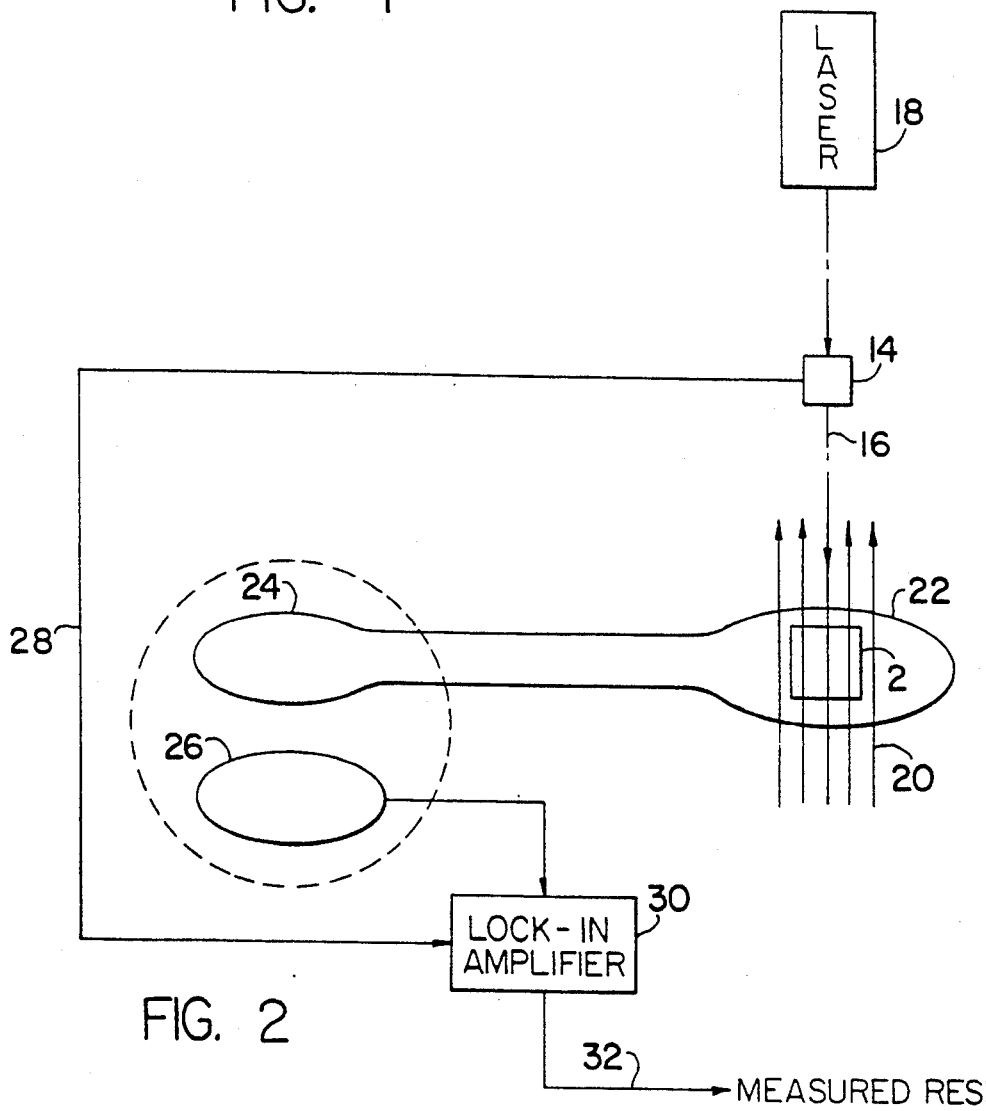
FIG. 2 is a schematic of a detector of the present invention that uses a SQUID to detect the response of the superconductor composite shown in FIG. 1 to electromagnetic radiation.

In addition to the superconductor composite, the detector of the present invention may include means for transmitting electromagnetic radiation to the superconductor particles. The means for transmitting electromagnetic radiation to the superconductor particles may be any means suitable for guiding radiation to the particles. For example, the means may include an optical fiber 12, shown in FIG. 1, for visible light and near infrared radiation, a transparent window on a cryostat in which the composite is cooled, or a microwave antenna for microwaves. If an optical fiber is used to illuminate the superconductor particles, the fiber may be multiplexed to several sources to permit a single detector to perform multiple duties. Also, an end of the optical fiber 12 can be embedded in the matrix 6 as shown in FIG. 1 such that the end of the fiber is substantially surrounded by superconductor particles 4 dispersed in the matrix. If desired, a chopper 14, shown in FIG. 2, or similar device may be used to modulate the radiation. The source of electromagnetic radiation may be any source that generates photons 16 of a detectable wavelength. For example, the source may be a laser 18, a heat source, or starlight.

Figure 3:
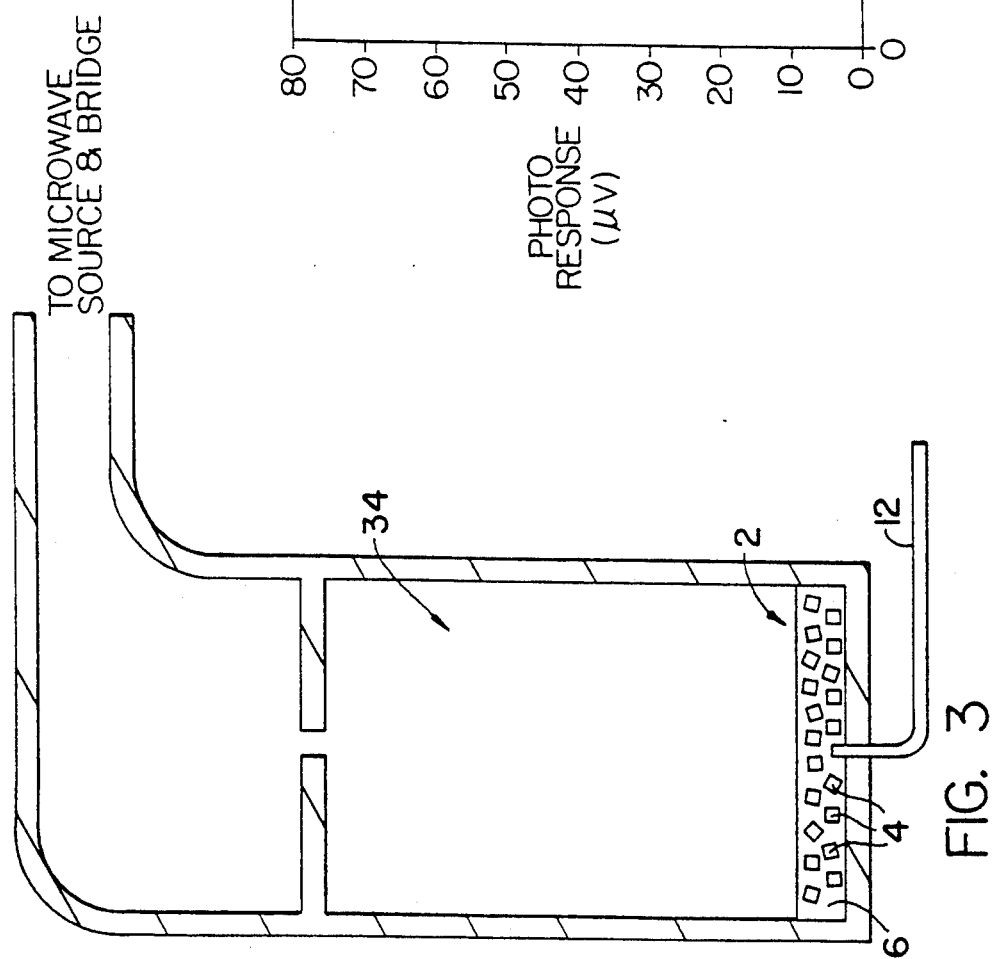
FIG. 3 is a sectioned elevation view of a detector of the present invention that uses a microwave cavity to detect the response of a superconductor composite to electromagnetic radiation.

The present invention also should include remote means for detecting a physical response of the superconductor particles to the electromagnetic radiation that may be any device capable of detecting such a response without physical or electrical contact with the composite. The physical response may be a change in the composite's diamagnetism, as indicated by flux changes in a magnetic field surrounding the composite or a change in the composite's microwave surface resistance. If a change in diamagnetism is to be measured, the detector's response may be enhanced by placing the composite in a suitably strong applied magnetic field, shown by the arrows 20 in FIGS. 1 and 2. The magnetic field may be generated by any conventional method, such as with an electromagnet or a permanent magnet. A permanent magnet may be desirable for applications in which an electromagnet is not convenient. If the means for detecting the physical response of the superconductor particles is sensitive enough, the Earth's magnetic field may be used as the applied magnetic field. A primary coil 22 surrounding the composite 2 may be used to detect changes in the field's flux caused by changes in the diamagnetism of the superconductor particles. The primary coil should not be in direct physical or electrical contact with the composite. The response picked up by the primary coil 22 may be transferred to a secondary coil 24, shown in FIG. 2. The response in the secondary coil 24 is measured by a conventional device, represented by the coil 26, such as a superconducting quantum interference device (SQUID), a Hall effect probe, or a radio frequency impedance detector. The response may be compared with a reference signal 28 in a lock-in amplifier 30 to generate a measured response signal 32. If a change in microwave surface resistance is to be measured, the superconductor composite 2 may be incorporated into a microwave cavity 34, as shown in FIG. 3. Specifically, the superconductor composite 2 can form a wall of the microwave cavity 34. Changes in microwave surface resistance can be detected by a microwave bridge as a change in the cavity's quality factor.

To operate the detector, the superconductor composite should be cooled to a temperature below its critical temperature ($T_c$) and illuminated with electromagnetic radiation. The composite may be cooled by any conventional means, such as by immersing it in liquid helium or liquid nitrogen or placing it in a variable temperature cryostat or cryocooler. A detector used in outer space may be cooled by exposure to ambient conditions.

The following example is given to demonstrate the present invention without limiting the invention's broad scope.

EXAMPLE

Figure 4:
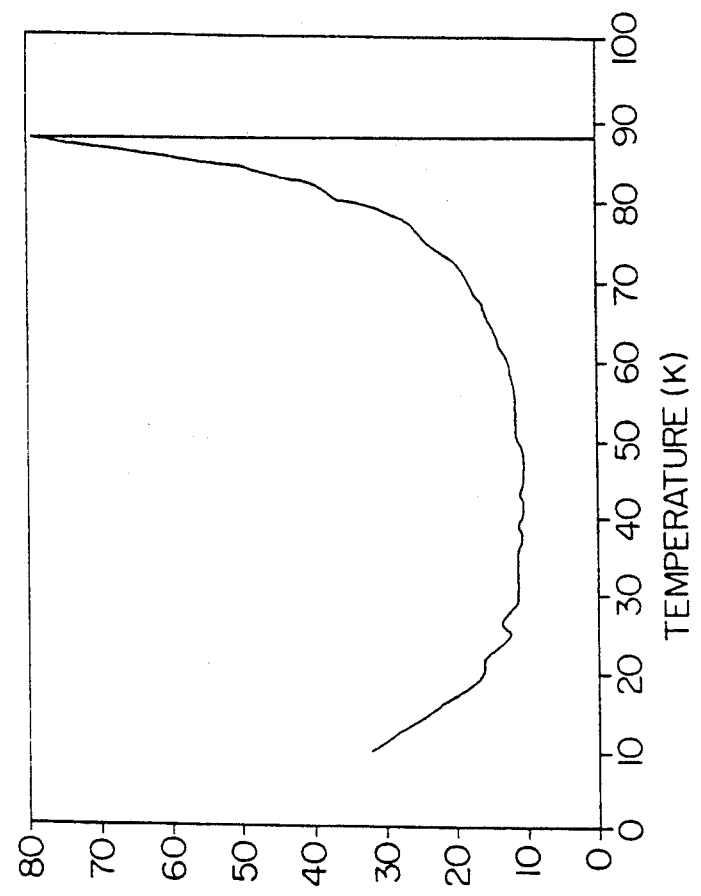
FIG. 4 is a graph of the photoresponse of a superconductor composite having YBCO and MgO particles in a paraffin wax matrix to 488 nm light versus temperature.

A quantity of YBCO high temperature superconductor was prepared by a conventional grinding, heating, and sintering method and was powdered with a mortar and pestle. The resulting superconductor powder had grains in the micron and submicron range. About 20 $\mu$g of the superconductor powder and about 20 $\mu$g of powdered MgO were stirred into a liquid paraffin wax which was permitted to solidify to form a superconductor composite. The MgO particles, which were about 200 mesh, served as a radiation trapping means. The composite was placed in a variable temperature cryostat surrounded by a pick-up coil and cooled to 10K under zero field conditions. A 50 Gauss magnetic field was established around the sample and the sample was illuminated with a 488 nm light through an optical fiber. The light, generated by a Lexel Model 65 argon ion laser (Lexel Corporation, Palo Alto, Calif.), was chopped at about 15 Hz. A lock-in amplifier showed that the composite responded to the light both in-phase and out-of-phase with a change in diamagnetism that was measured with a SQUID. FIG. 4 shows the photoresponse of the superconductor composite in microvolts as a function of temperature. The composite responded more strongly at very low temperatures and at temperatures near its critical temperature, which was between 80K and 90K.

Because the detector of the present invention provides a remotely detectable response to electromagnetic radiation, it is useful in applications in which direct physical or electrical contact with a superconductor electromagnetic radiation detector is undesirable or inconvenient. The use of a superconductor composite rather than a monolithic or film superconductor provides the opportunity to make the detector sensitive to specific wavelengths by varying the matrix composition and the superconductor particle size. Moreover, the use of a composite provides the ability to improve the detector's response to radiation by varying the superconductor particle composition, size, and orientation and by incorporating various radiation trapping means.

The invention is not limited to the particular embodiments shown and described herein. Various changes and modifications may be made without departing from the spirit or scope of the claimed invention.

We claim:

1. A superconductor electromagnetic radiation detector, comprising:
    (a) a superconductor composite having
        (i) a matrix transparent to electromagnetic radiation wavelengths to be detected; and
        (ii) a plurality of superconductor particles dispersed in the matrix;
    (b) means for transmitting electromagnetic radiation to the superconductor particles including an optical fiber with a first end, wherein the first end is embedded in the matrix such that the first end is substantially surrounded by the superconductor particles dispersed in the matrix; and
    (c) remote means for detecting a physical response of the superconductor particles to electromagnetic radiation; wherein the physical response of the superconductor particles to electromagnetic radiation indicates the presence of electromagnetic radiation.

2. The detector of claim 1 wherein the superconductor particles comprise a superconductor selected from the group consisting of $YBa_2Cu_3O_{7-\delta}$, $SmBA_2Cu_3O_{7-\delta}$, $Euba_2Cu_3O_{7\delta}$, $GdBa_2Cu_3O_{7-\delta}$, $DyBa_2Ba_2Cu_3O_{7-\delta}$, $HoBa_2Cu_3O_{7-\delta}$, $YbBa_2Cu_3O_{7-\delta}$, a Bi-Sr-Ca-Cu-O superconductor, and a Tl-Ba-Ca-Cu-O superconductor.

3. The detector of claim 1 wherein the supeconductor particles have dimensions about equal to the absorption depth of the radiation to be detected.

4. The detector of claim 1 wherein the superconductor particles have dimensions about equal to both the absorption depth of the radiation to be detected and the wavelength of the radiation to be detected.

5. The detector of claim 1 wherein the superconductor particles have at least one textured, reflective surface that functions as radiation trapping means.

6. The detector of claim 1 wherein the physical response of the superconductor particles to electromagnetic radiation is a change in microwave surface resistance and the remote means for detecting a physical response of the superconductor particles to the electromagnetic radiation include a microwave cavity, wherein the superconductor composite forms a wall of the microwave cavity.

7. A superconductor electromagnetic radiation detector, comprising:
 (a) a superconductor composite having
  (i) a matrix transparent to electromagnetic radiation wavelengths to be detected; and
  (ii) a plurality of superconductor particles dispersed in the matrix, wherein the superconductor particles comprise a superconductor selected from the group consisting of $Yba_2Cu_3O_{7-\delta}$, $SmBa_2Cu_3O_{7-\delta}$, $EuBa_2Cu_3O_{7-\delta}$, $GdBa_2Cu_3O_{7-\delta}$, $DyBa_2Cu_3O_{7-\delta}$, $HoBa_2Cu_3O_{7-\delta}$, $YbBa_2Cu_3O_{7-\delta}$, a Bi-Sr-Ca-Cu-O superconductor, and Tl-Ba-Ca-Cu-O superconductor;
 (b) means for transmitting electromagnetic radiation to the superconductor particles; and
 (c) remote means for detecting a physical response of the superconductor particles to electromagnetic radiation;
wherein the physical response of the superconductor particles to electromagnetic radiation indicates the presence of electromagnetic radiation.

8. The detector of claim 7 wherein the superconductor particles have dimensions about equal to the absorption depth of the radiation to be detected.

9. The detector of claim 7 wherein the superconductor particles have dimensions about equal to both the absorption depth of the radiation to be detected and the wavelength of the radiation to be detected.

10. The detector of claim 7 wherein the superconductor particles have at least one textured, reflective surface that functions as radiation trapping means.

11. The detector of claim 7 wherein the matrix is transparent to electromagnetic radiation in the microwave region of the electromagnetic spectrum and the mans for transmitting electromagnetic radiation to the superconductor particles include a microwave antenna.

12. The detector of claim 7 wherein the physical response of the superconductor particles to electromagnetic radiation is a change in microwave surface resistance and the remote means for detecting a physical response of the superconductor particles to the electromagnetic radiation includes a microwave cavity, wherein the superconductor composite forms a wall of the microwave cavity.

13. A method of detecting electromagnetic radiation, comprising:
 (a) illuminating a plurality of superconductor particles dispersed in a matrix of a superconductor composite with electromagnetic radiation in the visible, infrared, or microwave regions of the electromagnetic spectrum, wherein the matrix is transparent to electromagnetic radiation wavelengths to be detected; and
 (b) remotely detecting a physical response of the superconductor particles to the electromagnetic radiation; wherein the physical response of the superconductor particles to electromagnetic radiation indicates the presence of electromagnetic radiation.

14. The method of claim 13 wherein the superconductor particles are illuminated through an optical fiber having a first end embedded in the matrix such that the first end is substantially surrounded by the superconductor particles dispersed in the matrix.

15. The detector of claim 13 wherein the superconductor particles comprises a superconductor selected from the group consisting of $YB_2Cu_3O_{7-\delta}$, $SmBa_2Cu_3O_{7-\delta}$, $EuBa_2Cu_3O_{7-\delta}$, $GdBa_2Cu_3O_{7-\delta}$, $DyBa_2Cu_3)_{3-\delta}$, $HoBa_2Cu_3O_{7-\delta}$, $YbBa_2Cu_3)_{7-\delta}$, a Bi-Sr-Ca-Cu-O superconductor, and a Tl-Ba-Ca-Cu-O superconductor.

16. The detector of claim 13 wherein the physical response of the superconductor particles to electromagnetic radiation is a change in microwave surface resistance and the physical response of the superconductor particles to the electromagnetic radiation is detected with remote means that include a microwave cavity, wherein the superconductor composite forms a wall of the microwave cavity.

* * * * *

UNITED STATES PATENT AND TRADEMARK OFFICE
CERTIFICATE OF CORRECTION

PATENT NO. : 5,173,606

DATED : December 22, 1992

INVENTOR(S) : Bernard R. Weinberger et al

It is certified that error appears in the above-identified patent and that said Letters Patent is hereby corrected as shown below:

Column 1, line 60, after "matrix", insert --.--.

Claim 2, column 7, line 6, "$SmBA_2Cu_3O_{7-\delta}$", should be --$SmBa_2Cu_3O_{7-\delta}$--.

Claim 2, column 7, line 7, "$Euba_2Cu_3O_{7\delta}$", should be --$EuBa_2Cu_3O_{7-\delta}$--.

Claim 2, column 7, line 7, "$DyBa_2Ba_2Cu_3O_{7-\delta}$", should be --$DyBa_2Cu_3O_{7-\delta}$--.

Claim 7, column 7, line 36, "$Yba_2Cu_3O_{7-\delta}$", should be --$YBa_2Cu_3O_{7-\delta}$--.

Claim 15, column 8, line 41, "$YB_2Cu_3O_{7-\delta}$", should be --$YBa_2Cu_3O_{7-\delta}$--.

Claim 15, column 8, line 42, "$DyBa_2Cu_3)_{3-\delta}$", should be --$DyBa_2Cu_3O_{7-\delta}$--.

UNITED STATES PATENT AND TRADEMARK OFFICE
CERTIFICATE OF CORRECTION

PATENT NO. : 5,173,606

DATED : December 22, 1992

INVENTOR(S) : Bernard R. Weinberger et al

It is certified that error appears in the above-indentified patent and that said Letters Patent is hereby corrected as shown below:

Claim 15, column 8, line 43, "$YbBa_2Cu_3)_{7-\delta}$", should be --$YbBa_2Cu_3O_{7-\delta}$--.

Signed and Sealed this

Twenty-third Day of November, 1993

Attest:

BRUCE LEHMAN

Attesting Officer

Commissioner of Patents and Trademarks